(12) United States Patent
Vest

(10) Patent No.: US 7,154,296 B1
(45) Date of Patent: Dec. 26, 2006

(54) INTEGRATED BUS HOLD AND PULL-UP RESISTOR

(75) Inventor: William B. Vest, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/892,003

(22) Filed: Jul. 15, 2004

(51) Int. Cl.
  *H03K 19/173* (2006.01)
(52) U.S. Cl. ............ 326/37; 326/41; 326/82; 326/56
(58) Field of Classification Search ...... 326/37–38, 326/41, 55–58, 82–83, 47, 86, 90
  See application file for complete search history.

(56) References Cited

U.S. PATENT DOCUMENTS 6,172,519 B1 * 1/2001 Chiang et al. ............... 326/38
6,191,607 B1 * 2/2001 Meng et al. ................. 326/37
6,624,656 B1 * 9/2003 Fox et al. .................... 326/41
6,731,137 B1 * 5/2004 Rangan et al. .............. 326/86

* cited by examiner

*Primary Examiner*—Anh Q. Tran
(74) *Attorney, Agent, or Firm*—J. Matthew Zigmant; Townsend and Townsend and Crew LLP (57) ABSTRACT

Circuits, methods, and apparatus that combine a bus hold and a pull-up circuit in a die area efficient and conflict free manner. An exemplary embodiment of the present invention combines a bus hold resistor with a pull-up resistor. The resistor is connected between a pad and an inverter. When a user selects a bus hold function for the pad, the inverter is enabled and driven through a second inverting gate by the pad. When a pull-up function is selected, the inverter output is driven high. If neither function is selected, the inverter output is tri-stated. In this way, the die area of a second resistor is saved and potential conflicts between these alternately available functions are avoided.

15 Claims, 9 Drawing Sheets

INTEGRATED BUS HOLD AND PULL-UP RESISTOR

BACKGROUND

The present invention is generally related to output cells for integrated circuits, and more specifically to bus hold and pull-up resistors for output cells.

The complexity of modern field programmable gate arrays (FPGAs) has been increasing dramatically over the last few years. This complexity has allowed an increase in flexibility that has seen the inclusion of multiple circuits provided as functional alternatives for selection by circuit designers. This increased flexibility makes it easier to design an integrated circuit since a required circuit is more likely to be available.

Unfortunately, when two alternatives are provided on an FPGA, the result may be less than optimal. For example, extra die area is consumed, the two cells may conflict with each other, power may be wasted, or other unforeseen problems may arise.

Two cells that may be provided as alternative circuits are bus hold and pull-up circuits. These circuits are commonly used with tri-state output drivers. A bus hold circuit retains the last state on a line. This is particularly useful after a tri-state driver shuts off and before another tri-state driver becomes active. If this line is allowed to float, it may change state due to capacitive coupling from other lines. Even worse, its voltage may approach the threshold voltage of input cells on the line, creating metastability problems. A pull-up circuit pulls the voltage on a line to a supply, typically VCC, in the absence of an active driver on the line. Alternately, it may be used in lieu of an active pull-up device on a tri-state line.

When these cells are conventionally combined, the result is wasted die area since two large resistors are present but only one is used. Also, there is the possibility that both circuits may be enabled. If a bus hold circuit tries to pull a voltage on a line to ground while a pull-up circuit tries to pull it up to VCC, the result is an output voltage between the supplies. As above, this voltage may be near the threshold voltage of one or more input gates on the line, resulting in potential metastable conditions.

Thus, what is needed is an more efficient combination bus hold and pull-up circuit. It would be preferable if the combination saves die area and reduces the possibility of a conflict between the two functions.

SUMMARY

Accordingly, embodiments of the present invention provide circuits, methods, and apparatus that combine a bus hold and a pull-up circuit in a die area efficient manner.

An exemplary embodiment of the present invention combines a bus hold resistor with a pull-up resistor. The resistor is connected between a pad and an inverter. When a user selects a bus hold function for the pad, the inverter is enabled and driven through a second inverting gate by the pad. When a pull-up function is selected, the inverter output is driven high. If neither function is selected, the inverter output is tri-stated. In this way, the die area of a second resistor is saved and potential conflicts between these alternately available functions are avoided.

A better understanding of the nature and advantages of the present invention may be gained with reference to the following detailed description and the accompanying drawings.

DESCRIPTION OF EXEMPLARY EMBODIMENTS

Figure 1:
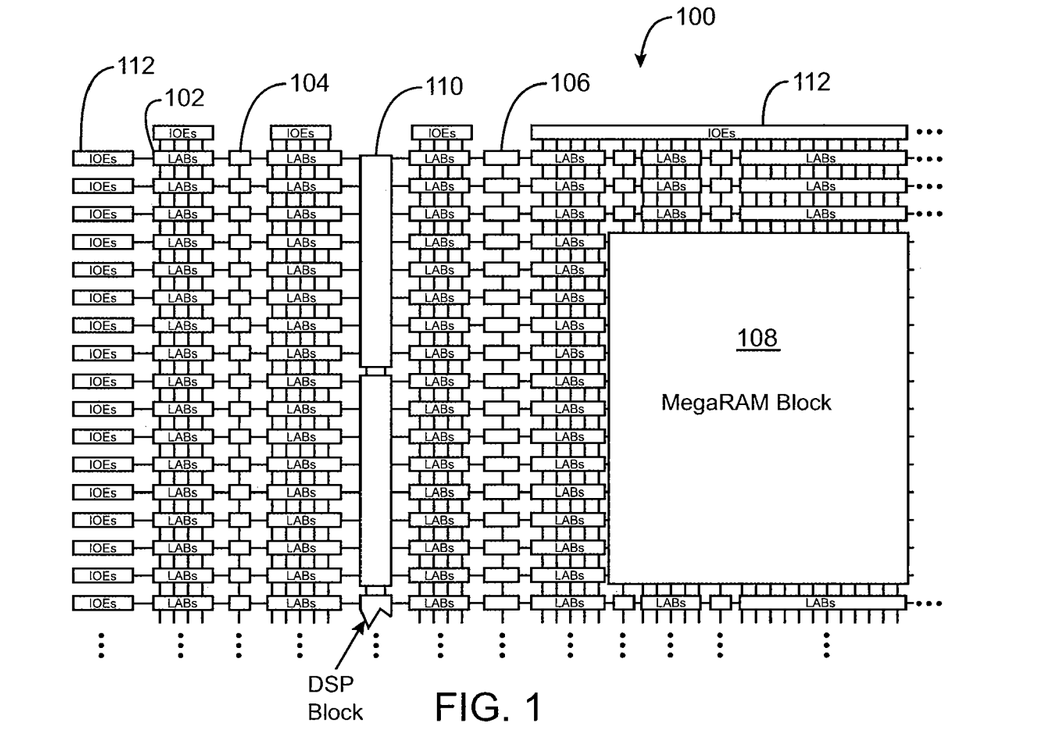
FIG. 1 is a simplified block diagram of a programmable logic device that may benefit by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106 and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be implemented in many different types of PLDs, FPGAs, and the other types of digital integrated circuits.

Figure 2:
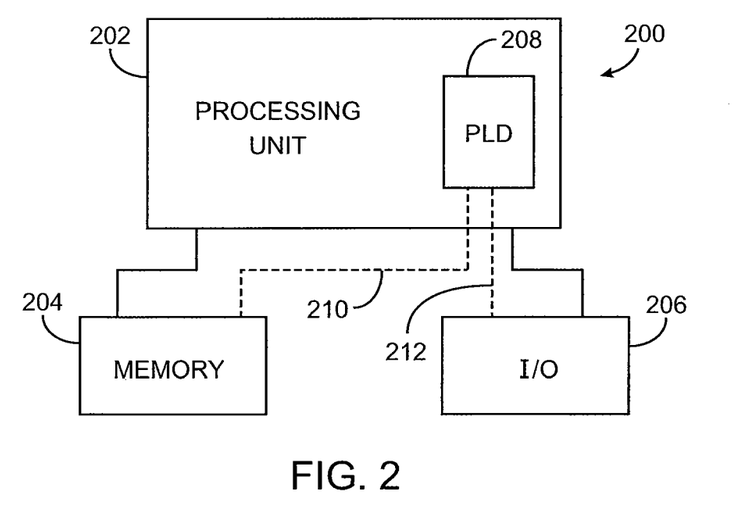
FIG. 2 is a block diagram of an electronic system that may benefit by the incorporating embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
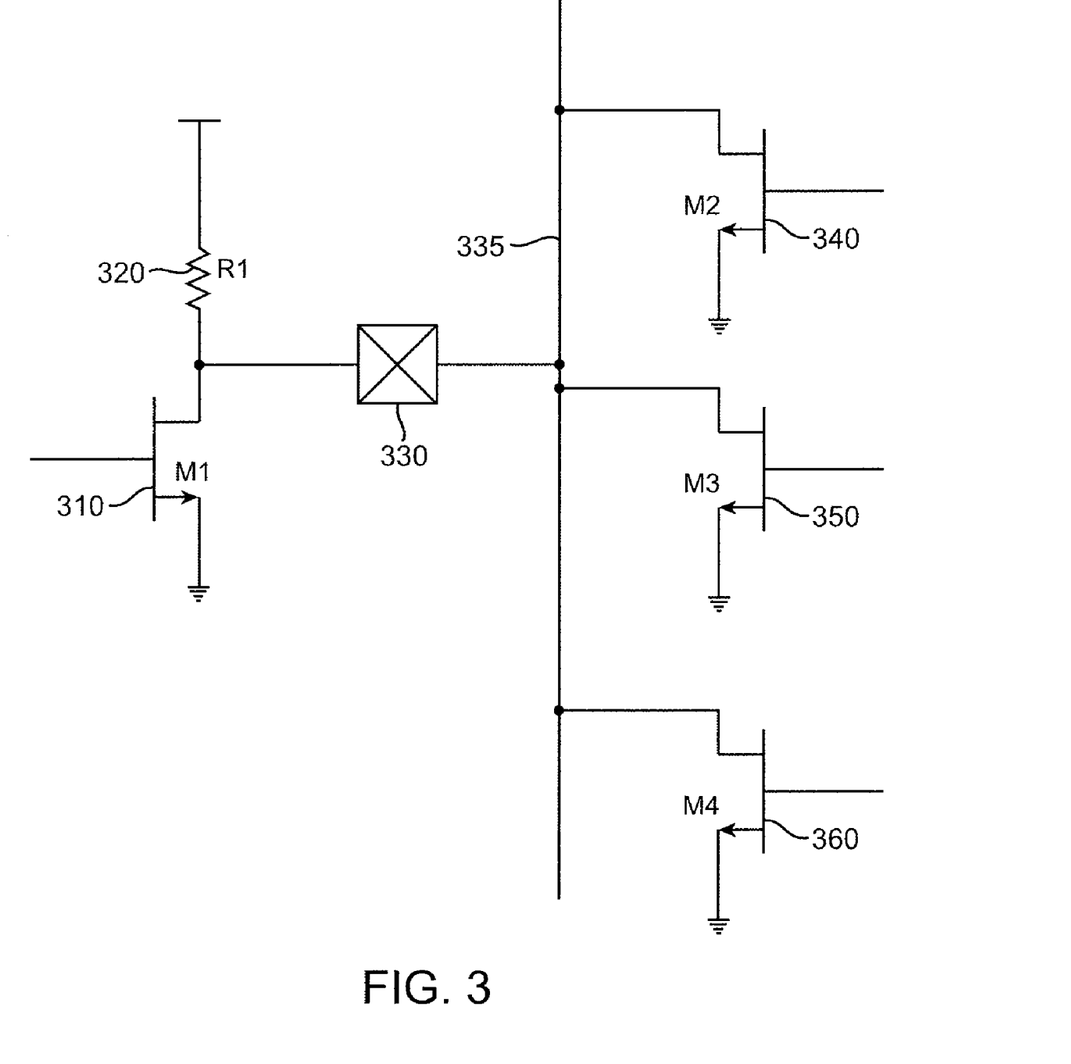
FIG. 3 is a schematic of an output cell connected to a tri-state bus, where the output cell incorporates a pull-up resistor.

FIG. 3 is a schematic of an output cell connected to a tri-state bus, where the output cell incorporates a pull-up resistor. This figure includes an output cell for an integrated circuit including a pull-down device M1 310 connected to a pad 330. The pad 330 is further connected to a tri-state line 335, which may be part of a tri-state bus. Three other drivers, which typically reside on other individual integrated circuits, are also connected to the tri-state line 335 and are represented by pull-down devices M2 340, M3 350, and M4 360.

In this figure, only pull-down devices are shown for individual output stages. In this case, R1 320 pulls the pad 330 and tri-state line 335 high in the absence of any of the drivers M1 310, M2 340, M3 350, or M4 360 pulling it down. In this type of configuration, R1 320 is typically a relatively lower value such that the rise time at the pad 330 and line 335 does not become excessive. In other embodiments, active pull-up devices are included in the output stages. In that case, R1 320 may be relatively larger value.

Figure 4:
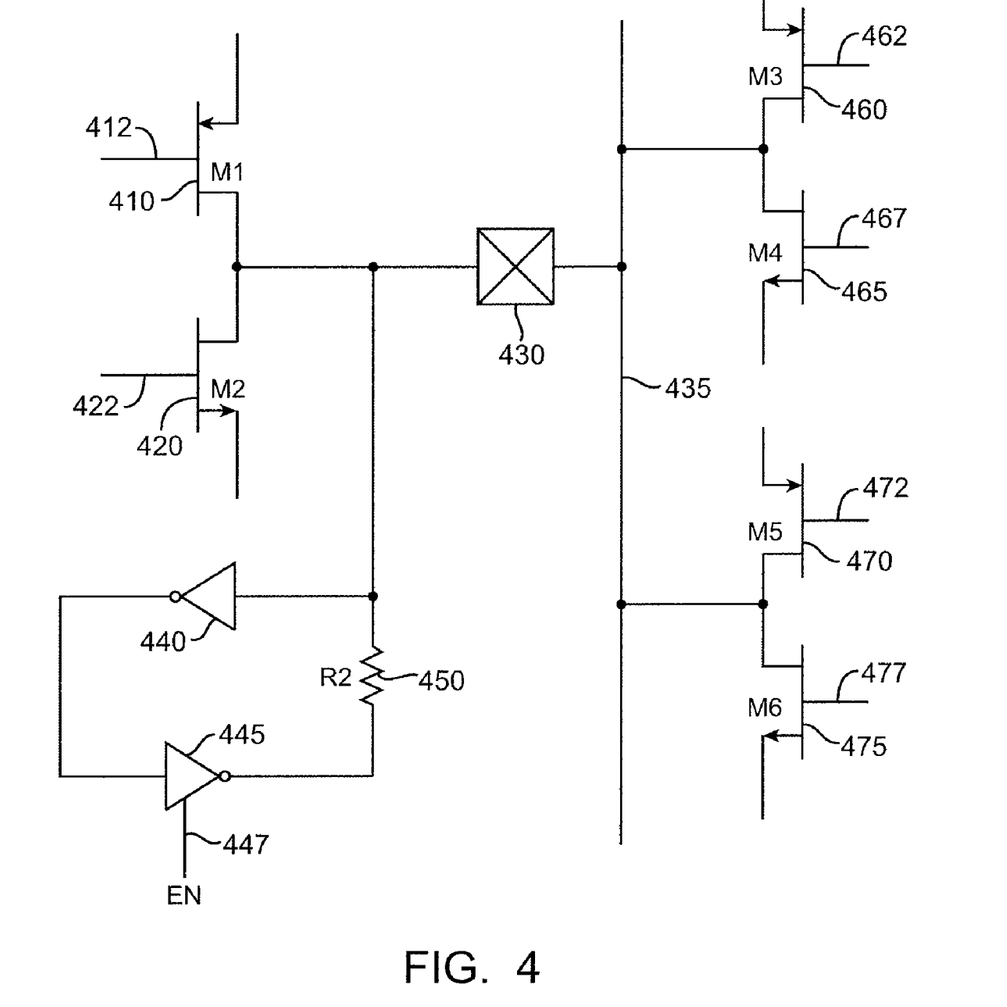
FIG. 4 is a schematic of an output cell connected to a tri-state bus, where the output cell incorporates a bus hold circuit.

FIG. 4 is a schematic of an output cell connected to a tri-state bus, where the output cell incorporates a bus hold circuit. This figure includes an output driver including a pull-up device M1 410 and pull-down device M2 420 connected to a pad 430, which is in turn coupled to a tri-state line 435. The output cell further includes a bus hold circuit including inverter 440, tri-state inverter 445, and resistor R2 450. Other output drivers are also connected to the tri-state line 435, and are represented by an output driver including M3 416 and M4 465, which typically resides on a second integrated circuit, and a second output driver including devices M5 570 and M6 465, which typically resides on a third integrated circuit.

When the enable signal on line 447 is such that the inverter 445 is enabled, the inverter 440 senses the voltage or logic stage at the pad 430, inverts that state and provides it to the inverter 445. The inverter 445 then again inverts the state and provides it as an output to the resistor R2 450. For example, if the voltage at the pad 430 is at ground, a logic low, inverter 440 provides a signal near VCC, a logic high, to the inverter 445. The inverter 445 then provides a voltage near ground, a logic low, to the resistor R2 450. If each of the output stages on line 435 are tri-stated, the resistor R2 450 then acts to hold the voltage at the pad 430 near ground, that is the logic low state at the pad 430 is retained in the absence of any active driver on line 435.

Figure 5:
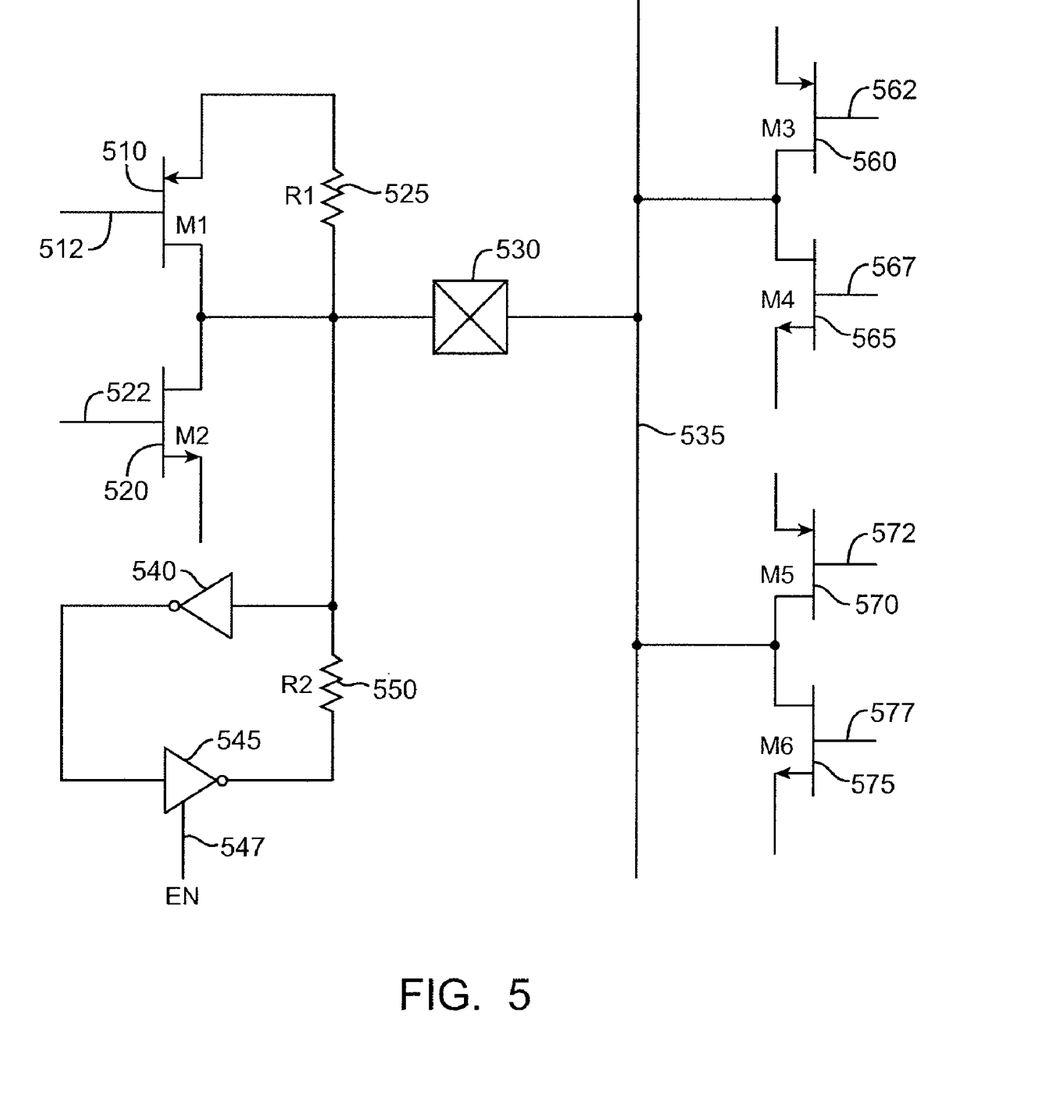
FIG. 5 is a schematic of an output cell connected to a tri-state bus, where the output cell incorporates both a pull-up resistor and a bus hold circuit.

FIG. 5 is a schematic of an output cell connected to a tri-state bus, where the output cell incorporates both a pull-up resistor and a bus hold circuit. This figure includes an output driver including a pull-up device M1 510 and a pull-down device M2 520, pull-up resistor R1 525, and a bus hold circuit including inverter 540, tri-state inverter 545, and hold resistor R2 550 which is connected to a pad 530. The pad 530 is in turn connected to tri-state line 535. The tri-state line 535 also connects to other output drivers, typically on other integrated circuits, represented here are by a first output stage including pull-up device M3 568 and pull-down device M4 565, and a second output stage including pull-up device M5 570 and a pull-down device M6 575.

A problem may arise when pull-up to resistor and bus hold circuit are included in the same output structure. Specifically, when a bus hold circuit tries to hold a low at the pad 530, the pull-up resistor R1 525 and bus hold resistor R2 550 fight each other, and in doing so provide an output voltage at the pad 530 that is and a voltage between VCC and ground or VSS. This is particularly troublesome if an input gate having a threshold voltage is coupled to the line 535. In this event, the input gate may become oscillatory, that is it may become unstable or enter a metastable condition.

Figure 6:
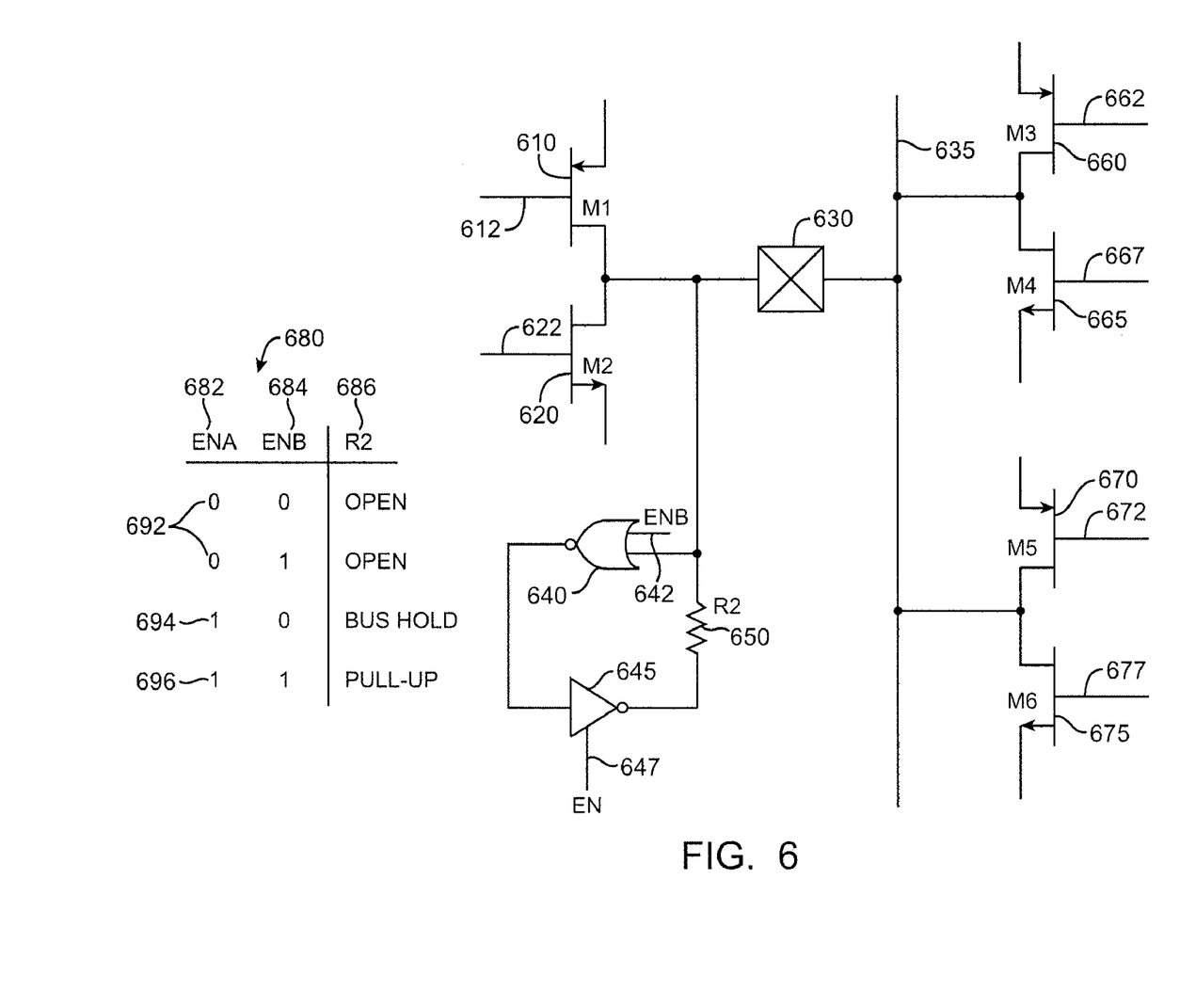
FIG. 6 is a schematic of an output cell connected to a tri-state bus, where the output cell incorporates an embodiment of the present invention.

FIG. 6 is a schematic of an output cell connected to a tri-state bus, where the output cell incorporates an embodiment of the present invention. This figure includes an output stage or cell simplified as a pull-up device M1 610 and pull-down device M2 620 connected to a pad 630, and a combined pull-up and bus hold circuit including NOR gate 640, tri-state inverter 645 and resistor R2 650. The pad 630 is in turn connected to tri-state line 635. Other output gates are shown as being connected to tri-state line 635 including two gates simplified as devices M3 660 and M4 665, and M5 670 and M6 675. Typically, the output driver simplified as devices M1 610 and M2 620, the pad 630, and the combined pull-up and bus hold circuit are integrated on a first integrated circuit, while the output gate simplified as M3 660 and M4 665 is integrated on a second integrated circuit and the output gate simplified as M5 670 and M6 675 are integrated on a third integrated circuit. The tri-state bus line 635 may be a PC board trace, a wire connecting two or more integrated circuits, or other appropriate conductor.

Figure 10:
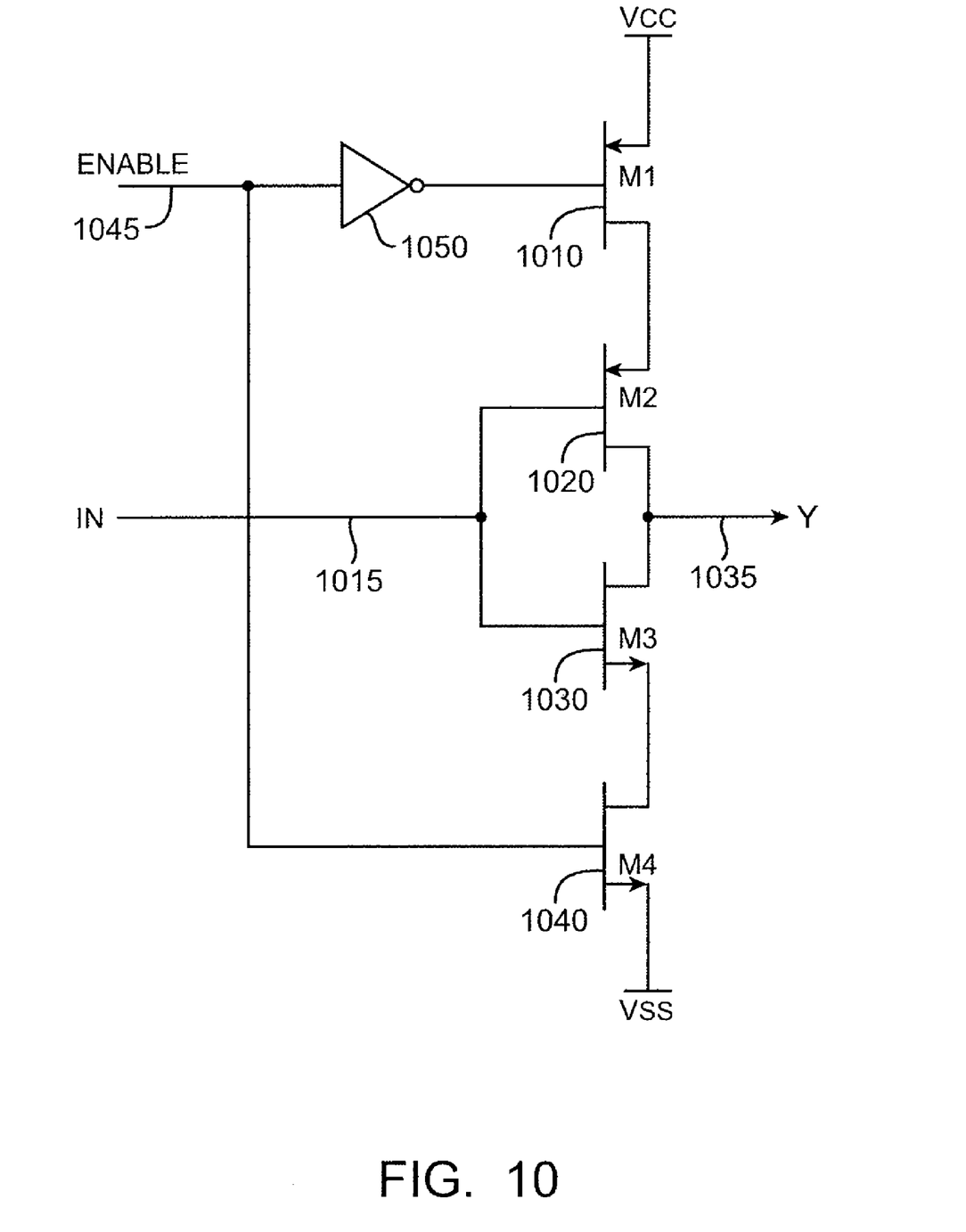
FIG. 10 is a schematic of a tri-state inverter that may be used by an embodiment of the present invention.

The output gate shown as M1 610 and M2 620 may be this or any other type of output gate, but is typically a tri-state output driver. One example of a tri-state output driver that may be used is shown in FIG. 10. Similarly, the output gate shown as M3 660 and M4 665 may be this or another type of gate. The same holds true for the gate shown as M5 670 and M6 675.

In this and the other included figures, a certain number of output gates are shown as being coupled to a tri-state line or conductor. In various implementations incorporating embodiments of the present invention, there may be different numbers of integrated circuits and output buffers coupled to the tri-state line or conductor. Also, input gates have not been shown for simplicity, though one or more input gates may be included, for example, each integrated circuit shown may include an input gate, and other input gates may reside on other integrated circuits not shown.

When the combined pull-up and bus hold circuit is to be used as a pull-up, the tri-state inverter 645 is enabled. The ENB signal on line 642 is high, thus forcing the output of the NOR gate 640 to be low. The output of the inverter 645 is high, thus resistor R2 650 acts as a pull-up resistor for the pad 630.

When the combined pull-up and bus hold circuit is to operate as a bus hold circuit, the tri-state inverter 645 is again enabled, and the ENB signal on line 642 is low. In this case the NOR gate 640 acts as an inverter, and inverts the logical state detected at the pad 630. Thus, the logic state detected at the pad 630 is provided by the output of the inverter 645 to the resistor R2 650.

Specifically, when the pad 630 is at a logical low, a logical low is provided by the inverter 645 to the resistor 650. In this way, if each of the drivers on the tri-state line 635 are in the high impedance state, the resistance R2 658 acts to retain the state at the pad 630 as a low. Similarly, if a high-level is to be held at the pad 630, a high is received by the NOR gate 640, which provides a low to the inverter 645, which in turn provides a high level to the resistance R2 650. In this way, the resistance R2 650 acts to hold the state at the pad 630 as a high when each of the drivers attached to be tri-state line 635 are in a high impedance condition.

When the combined pull-up and bus hold circuit is to be configured as a high impedance, that is neither the pull-up or bus hold function is desired, the tri-state inverter 645 is disabled.

The above is summarized in truth table 680. Specifically, when the ENA signal on line 647 is low, that is states 692, the impedance provided by resistance is R2 650 is an open. When ENA is high but ENB is low, that is state 694, resistance R2 650 acts a bus hold resistor. When both ENA and ENB are high, that is state 696, resistance R2 650 acts as a pull-up resistor.

The resistance R2 650 may be a resistor, or other resistive element such as a diode tied active MOS device. This resistance may be formed by using polysilicon layer, base diffusion, implant, source/drain diffusion, or other appropriate structure.

Figure 7:
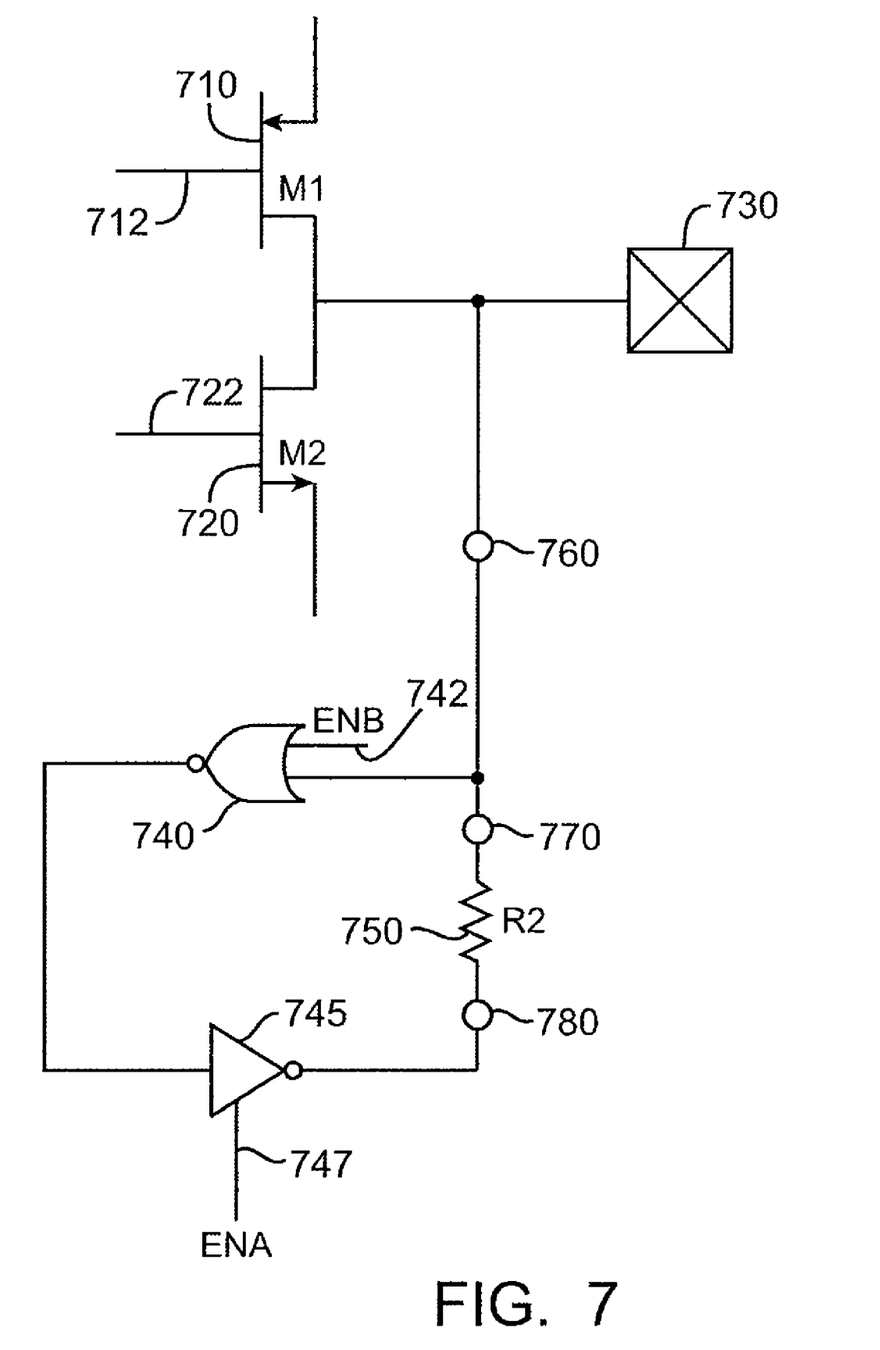
FIG. 7 is a schematic of an output cell incorporating a further embodiment of the present invention.

FIG. 7 is a schematic of an output cell incorporating a further embodiment of the present invention. This figure includes an output driver simplified as devices M1 710 and M2 720, a combined pull-up and bus hold circuit including NOR gate 740, tri-state inverter 745, and resistance R2 750. Also shown are programmable switches 760, 770, and 780.

These programmable switches may be part of the configuration of the output cell. In various embodiments of the present invention, one or more of these switches may be included, or other switches may be included. These switches may include fuses, anti-fuses, pass gates, pass devices, or other programmable or configurable devices, and may be controlled by bits stored in EEPROM, Flash, SRAM, DRAM, MRAM, fuse, antifuse, or other structures.

Figure 8:
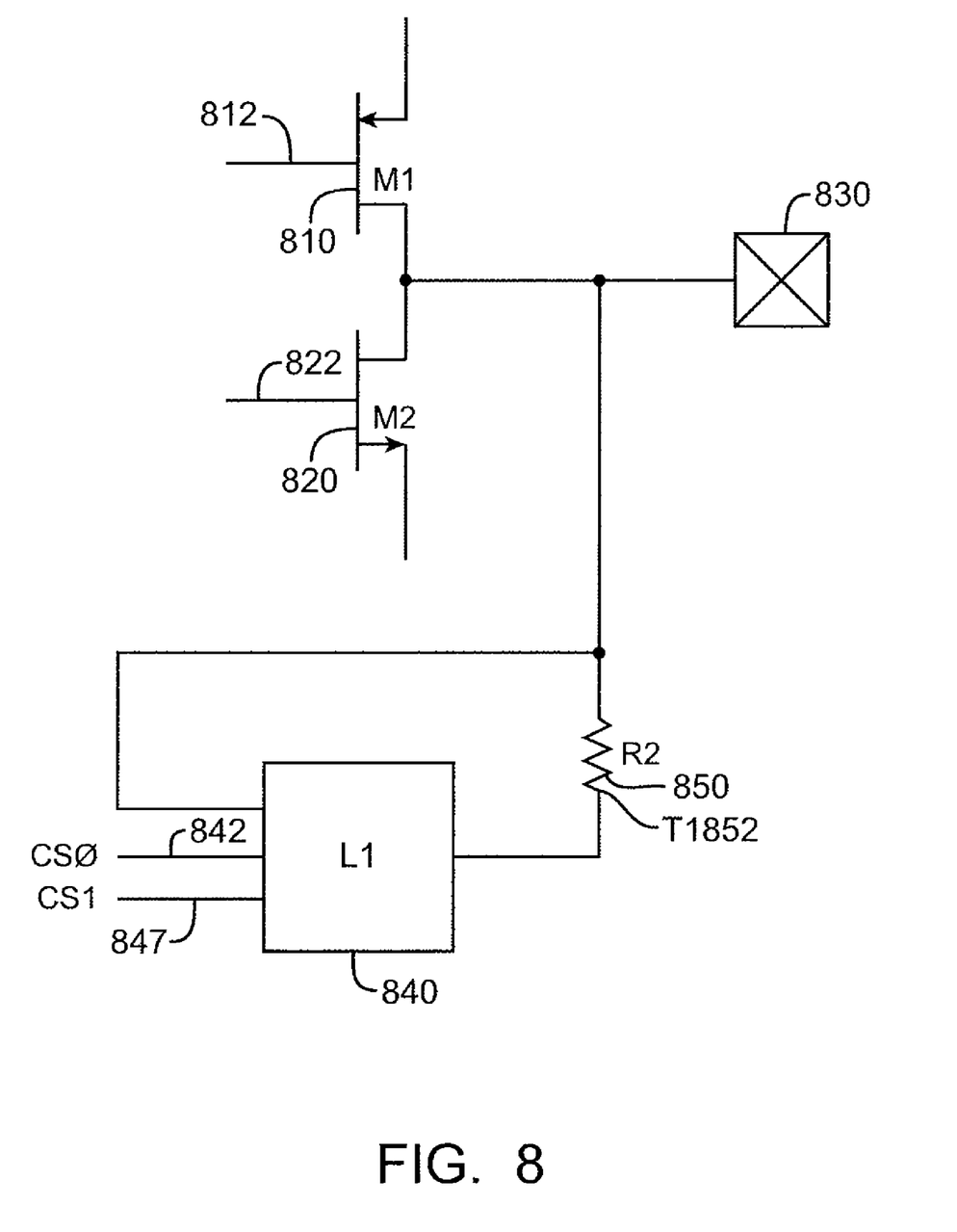
FIG. 8 is a schematic of an output cell incorporating yet a further embodiment of the present invention.

FIG. 8 is a schematic of an output cell incorporating yet a further embodiment of the present invention. This figure includes an output stage simplified as devices M1 810 and M2 820, resistance R2 850, and logic circuit L1 840, each connected to a pad 830.

The logic circuit L1 840 receives a number of control signals, in this specific example two control signals CS0 on line 842 and CS1 on line 847. Depending on the states of CS0 and CS1 on lines 842 and 847, the logic circuit L1 840 provides a high, a logic state equal to a logic state detected on the pad 830, or a high impedance to terminal T1 852 of resistor R2 850.

If a high logic level is provided by the logic circuit L1 840, then R2 850 acts as a pull-up resistor. If the logic circuit L1 840 provides the same logic state as it detects on the pad 830, then resistor R2 850 acts as a bus hold circuit. If the logic circuit L1 840 provides a high impedance, then the resistor R2 850 provides no function, and appears as an open circuit.

In this figure, L1 840 is shown as receiving two control signals. In other embodiments of the present invention, there may be a different number of control signals, for example there may be 1 or 3 or more control signals received by the logic circuit L1 840. For example, there may be one control signal that selects between pull-up and bus hold functions, particularly where there is no need for a high impedance option.

Figure 9:
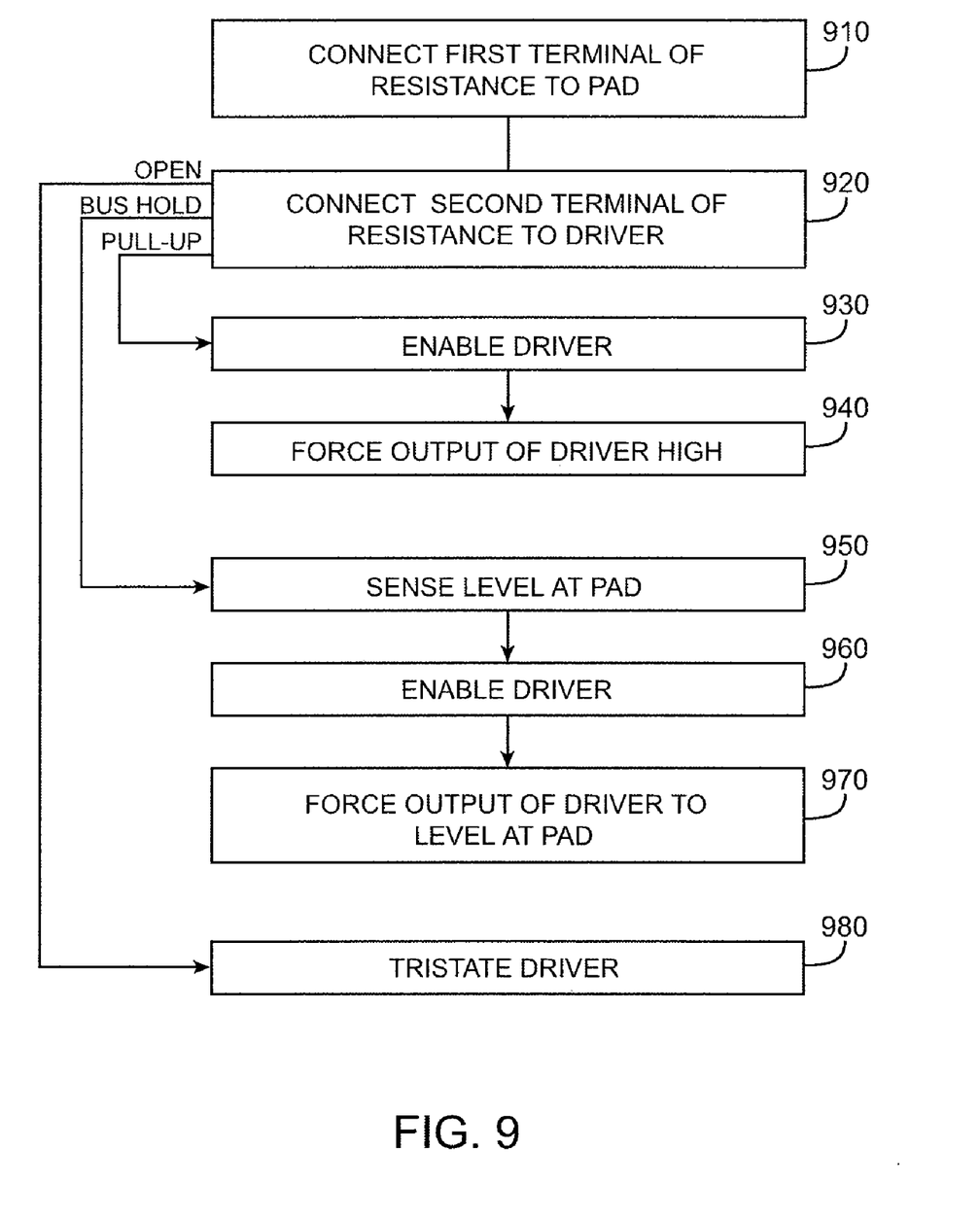
FIG. 9 is a flowchart illustrating an embodiment of the present invention.

FIG. 9 is a flowchart illustrating an embodiment of the present invention. In act 910, a first terminal of a resistance is connected to a pad. In act 920, a second terminal of the resistance is connected to a driver. At that point it is determined whether the resistance is to form an open circuit, a bus hold circuit, or a pull-up. If a pull-up is desired, the driver is enabled in act 930, and in act 940 the output of the driver is driven high.

If a bus hold circuit is desired, in act 950 a logic state at the pad is determined. The driver is enabled in act 960, and the driver is driven to the logic state determined to be at the pad in act 970. If an open circuit is desired, the driver is tri-stated in act 980.

FIG. 10 is a schematic of a tri-state driver or inverter that may be used by an embodiment of the present invention. This driver or inverter may be used as an output driver, for example, the output driver shown as the simplified driver including M1 610 and M2 620 in FIG. 6, or as the tri-state inverter 645 in FIG. 6.

This figure includes a pull-up device M2 1020 and pull-down device M3 1030, as well as tri-state devices M1 1010 and M4 1040. Inverter 1015 inverts the enable signal received on line 1045. An input signal is received on line 1015 and is inverted when the gate is enabled.

When a low enable signal on line 1045 is received, the device M4 1040 is on and conducting. The inverter 1050 inverts this logic level and provides a low signal level to device M1 1010, also turning on that device. In this mode, the input signal received on line 1015 is inverted and provided as the output signal Y on line 1035.

When the enable signal on line 1045 is low, device M4 1040 is off. The inverter 1050 inverts the low signal and provides a high level signal to device M1 1010, thus also shutting off that device. In this case, a high impedance is presented at the output Y on line 1035 independent of the input signal level on line 1015.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a pad;
   a tri-state output driver coupled to the pad;
   a programmable switch having a first terminal coupled to the pad;
   a resistance having a first terminal coupled to a second terminal of the programmable switch;
   a logic circuit having an output coupled to a second terminal of the resistance and a first input coupled to the second terminal of the programmable switch; and
   a first control line coupled to a second input of the logic circuit,
   wherein when the first control line is in a first state the output of the logic circuit provides a first voltage level and when the first control line is in a second state the output of the logic circuit provides the first voltage level if a voltage on the pad is near the first voltage level and a second voltage level if the voltage on the pad is near the second voltage level.

2. The integrated circuit of claim 1 further comprising:
   a second control line coupled to a third input of the logic circuit,
   wherein when the second control line is in the first state the output of the logic circuit provides a high impedance.

3. The integrated circuit of claim 2 wherein the first voltage level is approximately equal to VCC and the second voltage level is approximately equal to ground.

4. The integrated circuit of claim 1 wherein the logic circuit comprises a first logic gate having an input coupled to the second terminal of the programmable switch and a second input coupled to the first control line.

5. The integrated circuit of claim 1 wherein the integrated circuit is a programmable logic device.

6. The integrated circuit of claim 1 wherein the resistance is a resistor.

7. The integrated circuit of claim 1 wherein the resistance is an active device.

8. The integrated circuit of claim 4 wherein the logic circuit further comprises a second logic gate having a first input coupled to an output of the first logic gate and a second input coupled to receive a second control line,
   wherein the second logic gate comprises:
      a first pull-up transistor;
      a second pull-up transistor coupled between the second terminal of the resistance and the first pull-up transistor;
      a first pull-down transistor; and
      a second pull-down transistor coupled between the pa second terminal of the resistance and the first pull-down transistor.

9. The integrated circuit of claim 8 wherein a first signal on the first control line selects between a pull-up and bus hold configuration, and a second signal on the second control line selects between an open circuit and either the pull-up or bus hold configurations.

10. The integrated circuit of claim 8 wherein the integrated circuit is a field programmable gate array.

11. The integrated circuit of claim 1 wherein the programmable switch comprises a pass device.

12. The integrated circuit of claim 1 wherein the programmable switch comprises a transistor.

13. The integrated circuit of claim 8 wherein when the second control line is in the first state, the output of the logic circuit provides a high impedance.

14. The integrated circuit of claim 8 wherein when the second control line is in the second state, the output of the logic circuit provides a high impedance.

15. The integrated circuit of claim 1 further comprising:
   a second control line coupled to a third input of the logic circuit,
   wherein when the second control line is in the second state, the output of the logic circuit provides a high impedance.

* * * * *